US008164802B2

(12) United States Patent
Pedley et al.

(10) Patent No.: US 8,164,802 B2
(45) Date of Patent: Apr. 24, 2012

(54) DEVICE, SYSTEM, AND METHOD FOR SCANNING PAPER MEDIA

(76) Inventors: Douglas Pedley, San Diego, CA (US); Steve Jackson, Lafayette, CA (US); J. Eric Churilla, San Diego, CA (US)

( * ) Notice: Subject to any disclaimer, the term of this patent is extended or adjusted under 35 U.S.C. 154(b) by 2024 days.

(21) Appl. No.: 10/243,523

(22) Filed: Sep. 13, 2002

(65) Prior Publication Data
US 2004/0051913 A1 Mar. 18, 2004

(51) Int. Cl.
*H04N 1/04* (2006.01)
*H04N 1/40* (2006.01)
(52) U.S. Cl. ............... 358/474; 358/443; 358/471
(58) Field of Classification Search ........... 358/474, 358/496, 498, 443, 408, 505, 471, 401, 501; 382/312, 318, 319, 131, 100; 324/307; 436/173
See application file for complete search history.

(56) References Cited

U.S. PATENT DOCUMENTS

| | | | | |
|---|---|---|---|---|
| 4,608,977 A * | 9/1986 | Brown | ........... | 606/130 |
| 4,694,250 A * | 9/1987 | Iwaoka et al. | ........... | 324/309 |
| 5,377,022 A * | 12/1994 | Street et al. | ........... | 358/498 |
| 5,886,898 A | 3/1999 | Choudhury et al. | | |
| 5,935,065 A | 8/1999 | Rose, Jr. et al. | | |
| 6,026,143 A * | 2/2000 | Simanovsky et al. | ........... | 378/57 |
| 6,075,622 A * | 6/2000 | Hadgis et al. | ........... | 358/474 |
| 6,195,444 B1 * | 2/2001 | Simanovsky et al. | ........... | 382/100 |
| 6,236,831 B1 | 5/2001 | Mei et al. | | |
| 6,398,431 B2 | 6/2002 | Kimura et al. | | |
| 6,606,091 B2 * | 8/2003 | Liang et al. | ........... | 345/424 |
| 6,760,132 B1 * | 7/2004 | Shibata | ........... | 358/488 |
| 6,940,664 B1 * | 9/2005 | Pilu | ........... | 359/806 |
| 7,574,030 B2 * | 8/2009 | Fors et al. | ........... | 382/131 |
| 7,813,011 B2 * | 10/2010 | Yan | ........... | 358/474 |
| 7,911,657 B2 * | 3/2011 | Yan | ........... | 358/474 |
| 7,916,358 B2 * | 3/2011 | Yan | ........... | 358/474 |
| 2001/0033682 A1 | 10/2001 | Robar et al. | | |
| 2007/0030536 A1 * | 2/2007 | Yan | ........... | 358/505 |
| 2007/0091385 A1 * | 4/2007 | Yan | ........... | 358/474 |
| 2008/0088888 A1 * | 4/2008 | Yan | ........... | 358/474 |
| 2009/0316221 A1 * | 12/2009 | Yan | ........... | 358/474 |
| 2010/0033772 A1 * | 2/2010 | Borison et al. | ........... | 358/474 |
| 2010/0097662 A1 * | 4/2010 | Churilla et al. | ........... | 358/448 |
| 2010/0322373 A1 * | 12/2010 | Churilla | ........... | 378/4 |

FOREIGN PATENT DOCUMENTS
EP 0 478 352 A2 1/1992
JP 2001 260336 9/2001

OTHER PUBLICATIONS

C. Jager, Spectral properties of carbon black, Journal of Non-Crystalline Solids 258 (1999), 161-179, Elsevier, Berlin, Germany.
Hans Darmstadt et al. Solid State 13C-NMR Spectroscopy and XRD Studies of Commercial and Pyrolytic Carbon Black.

* cited by examiner

*Primary Examiner* — Cheukfan Lee
(74) *Attorney, Agent, or Firm* — J. Eric Churilla

(57) ABSTRACT

A system for scanning paper media is disclosed and may include at least one microprocessor. The system may also include a scanner connected to the microprocessor. The scanner may simultaneously scan two or more printed pages using computed tomography and send a three-dimensional data set to the microprocessor that represents the printed pages.

15 Claims, 13 Drawing Sheets system architecture

DEVICE, SYSTEM, AND METHOD FOR SCANNING PAPER MEDIA

TECHNICAL FIELD

The present invention relates generally to scanning paper media.

BACKGROUND OF THE INVENTION

Nearly every business utilizes a measurable amount of paper documents. These businesses include law firms, accounting firms, medical offices, insurance companies, building contractors, manufacturers, retailers, etc. Moreover, it is well known that government agencies are prone to extreme usages of paper. Many of these businesses and government agencies must capture information from the paper documents, copy them for exchange, and/or maintain an archive of at least a portion of the documents that they use or otherwise encounter—either by storing copies of the paper documents or by creating electronic archives.

Copying these documents and capturing information from the paper documents can be very expensive and very labor intensive. It has been estimated that each year nearly two-hundred and fifty billion dollars ($250 B) are spent world wide on data entry, i.e., the manual entering of information from paper documents. However, with all this money spent, information is captured from only five percent (5%) of the available documents. Further, it has been also estimated that world wide there are nearly one-hundred million (100 M) unique books that are not available in electronic form. Currently, there are ongoing book scanning projects that utilize planetary scanners, flat bed scanners, and pass-through scanners to create electronic databases from these books using imaging techniques and optical character recognition (OCR) software to "read" the ink printed on the pages of the books. These same scanners are also being used to scan documents and electronically capture all or a portion of the information printed on the documents to create databases therefrom.

Planetary scanners typically use a digital imaging device mounted on an arm such that the imaging device faces down. A book can be opened face-up beneath the imaging device and each page can be individually scanned into the database. Planetary scanners are relatively expensive and using them to scan individual books is very time intensive. For example, it can take nearly three hours to scan a single book having three hundred pages. Planetary scanners are not typically used to scan loose documents.

Flat bed scanners can be used to scan loose documents and books. Loose documents can be fed manually or mechanically to the scanner and then scanned therein. With a mechanical feeder, e.g., an automatic paper feeder, and a very fast scan time, up to two hundred pages per minute can be scanned. However, a machine with such capabilities can cost as much as one hundred thousand dollars ($100,000). Also, to prevent damage to the paper feeder, the scanner, or the documents, great care must be taken to remove any staples and/or paperclips that may be included in the documents.

When using a flat bed scanner to scan books, each book is opened and placed face down on a transparent scan bed. An internal scanning device moves beneath the scan bed and scans the page of the book. Unfortunately, most books, e.g., those with bound spines, cannot be placed on the scan bed such that the page to be scanned is entirely flat. This results in an image that is bent, shadowy, and grey where the page bends into the spine of the book. Thus, data from the page is lost or inaccurately recognized by the OCR software. In order to correct this problem, a book that must be scanned can be taken apart, i.e., the pages can be separated from the spine and each other. The individual pages can be placed face down on the plenum and then scanned the same as loose documents. However, dismantling a book essentially renders it useless for future reading. Pass through scanners can also be used, but the books also have to be dismantled and individually fed to the scanner, either manually or mechanically.

The present invention has recognized these prior art drawbacks, and has provided the below-disclosed solutions to one or more of the prior art deficiencies.

SUMMARY OF THE INVENTION

The preferred embodiment of the present invention will now be described, by way of example, with reference to the accompanying drawings, in which:

DESCRIPTION OF AN EMBODIMENT OF THE INVENTION

Figure 1:
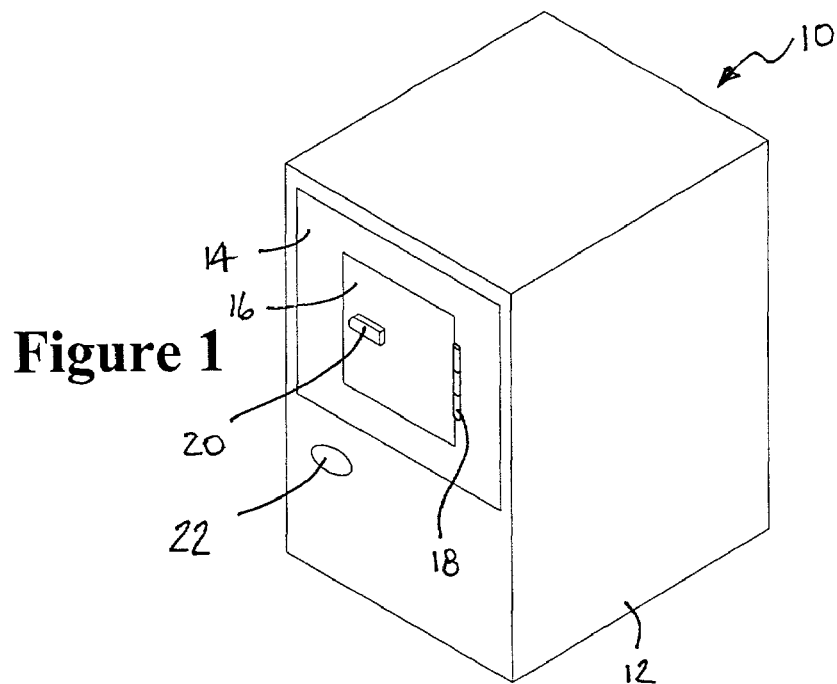
FIG. 1 is a front plan view of a scanner.

Referring initially to FIG. 1, a scanner is shown and is generally designated 10. FIG. 1 shows that the scanner 10 includes a housing 12 having a removable front panel 14. A door 16 can be incorporated into the front panel 14. Preferably, the door 16 is attached to the front panel 14 by a hinge 18 and it rotates about the hinge 18 when it is opened and closed. The door 16 includes a handle 20 that can be used to latch and unlatch the door 16. As shown in FIG. 1, a scan button 22 can be incorporated into the front of the housing 12. It is to be understood that the scan button 22 can be toggled in order to begin the scan process, described in detail below.

Figure 2:
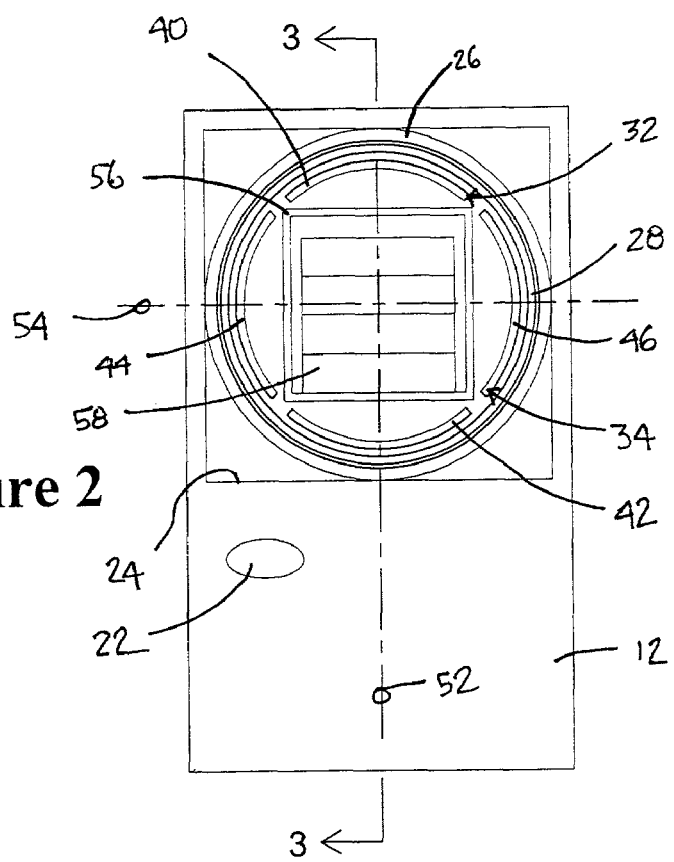
FIG. 2 is a front plan view of the scanner with a front panel removed.
Figure 3:
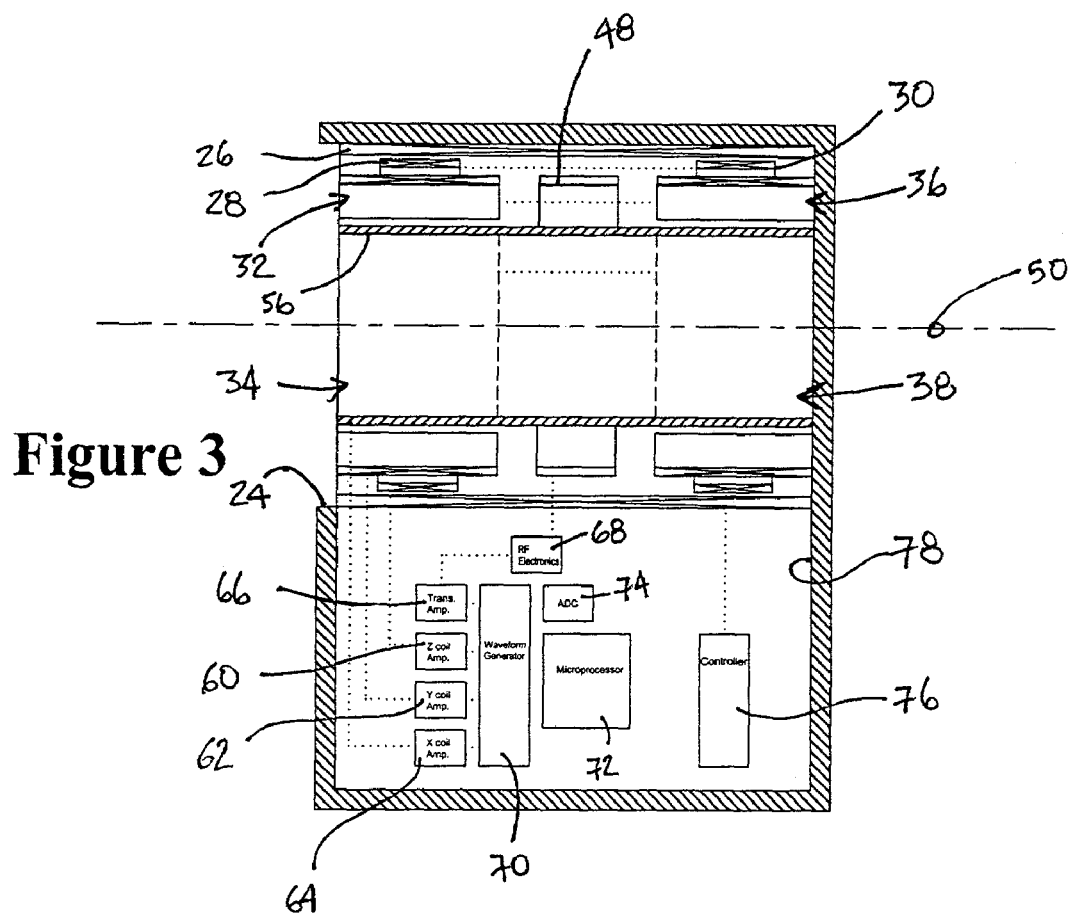
FIG. 3 is a cross-section view of the scanner taken along line 3-3 in FIG. 2.

Referring now to FIGS. 2 and 3, details concerning the internal components of the scanner 10 are shown. As shown, the housing 12 includes an opening 24 in which the front panel 14 (FIG. 1) fits. A generally cylindrical main coil assembly 26 is disposed within the housing 12. A generally cylindrical first Z-coil assembly 28 and a generally cylindrical second Z-coil assembly 30 are disposed within the main coil 26 near respective ends thereof. Moreover, a first Y coil assembly 32 and a first X coil assembly 34 are disposed within the first Z-coil assembly 28. A second Y coil assembly 36 and a second X coil assembly 38 are disposed within the second Z-coil assembly 30.

Each Y coil assembly 32, 36 includes a first saddle-shaped coil 40 and a second saddle-shaped coil 42 placed within respective Z-coil assemblies 28, 30 opposite each other. Also, each X coil assembly 34, 38 includes a first saddle-shaped coil 44 and a second saddle-shaped coil 46 placed within the respective Z-coil assemblies 28, 30 opposite each other. FIG. 3 further shows a transceiver coil assembly 48 that is disposed within the main coil assembly 26 between the first coil assemblies 28, 32, 34 and the second coil assemblies 30, 36, 38.

It is to be understood that the main coil assembly 26 can be used to create a magnetic field along a Z axis 50 defined by the scanner 10 from the front of the scanner 10 to the back of the scanner 10. The Z-coil assemblies 28, 30 can be used to vary the magnetic field along the Z axis 50. The Y-coil assemblies 32, 36 can be used to vary the magnetic field along a Y axis 52 defined by the scanner 10 perpendicular to the Z axis 50 from the top of the scanner 10 to the bottom of the scanner 10. Also, the X-coil assemblies 34, 38 can be used to vary the magnetic field along an X axis 54 defined by the scanner 10. The X axis 54 is perpendicular to the Z axis 50 and the Y axis 52 and is established from side to side. The transceiver coil assembly 48 is used to send and receive radio frequency signals.

As shown in FIGS. 2 and 3, all of the coil assemblies 26, 28, 30, 32, 34, 36, 38 are centered on the Z axis 50. Moreover, the saddle-shaped coils 40, 42, 44, 46 comprising each Y coil assembly 32, 36 and each X coil assembly 34, 38 are alternating and equally spaced around the Z axis 50 within the Z coil assemblies 28, 30. FIG. 2 also shows a paper media support tray 56 in which paper media 58 that is to be scanned can be placed.

Referring to FIG. 3, a Z coil amplifier 60 is connected to the Z coil assemblies 28, 30. A Y coil amplifier 62 is connected to the Y coil assemblies 32, 36. Moreover, an X coil amplifier 64 is connected to the X coil assemblies 34, 38. Moreover, a transceiver amplifier 66 is connected to the transceiver coil assembly 48 through appropriate radio frequency (RF) electronics 68. A waveform generator 70 is connected to the amplifiers 60, 62, 64, 66. FIG. 3 shows that a microprocessor 72 is connected to the waveform generator 70 and to the RF electronics through an analog-to-digital converter 74. As shown in FIG. 3, a controller 76 is connected to the main magnet assembly 26. FIG. 3 also shows that a magnetic field shielding layer 78 can be disposed on the interior of the housing 12.

Figure 4:
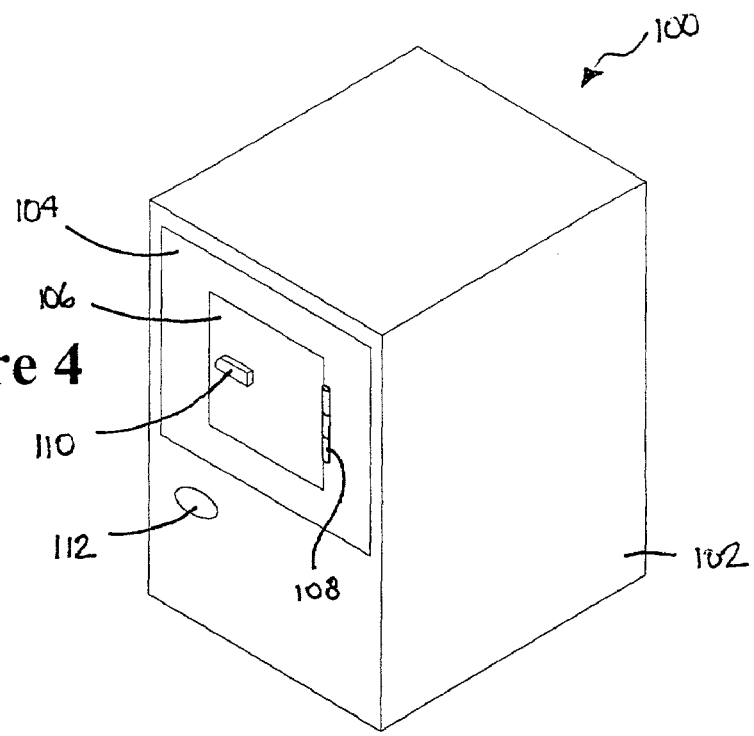
FIG. 4 is a front plan view of an alternate scanner.

Referring now to FIG. 4, an alternate embodiment of a scanner is shown and is generally designated 100. FIG. 4 shows that the scanner 100 includes a housing 102 having a removable front panel 104. As shown, a door 106 can be incorporated into the front panel 104. Preferably, the door 106 is attached to the front panel 104 by a hinge 108 and it rotates about the hinge 108 when it is opened and closed. The door 106 also includes a handle 110 that can be used to latch and unlatch the door 106. As shown in FIG. 4, a scan button 112 can be incorporated into the front of the housing 102. It is to be understood that the scan button 112 can be toggled in order to begin the scan process, described in detail below.

Figure 5:
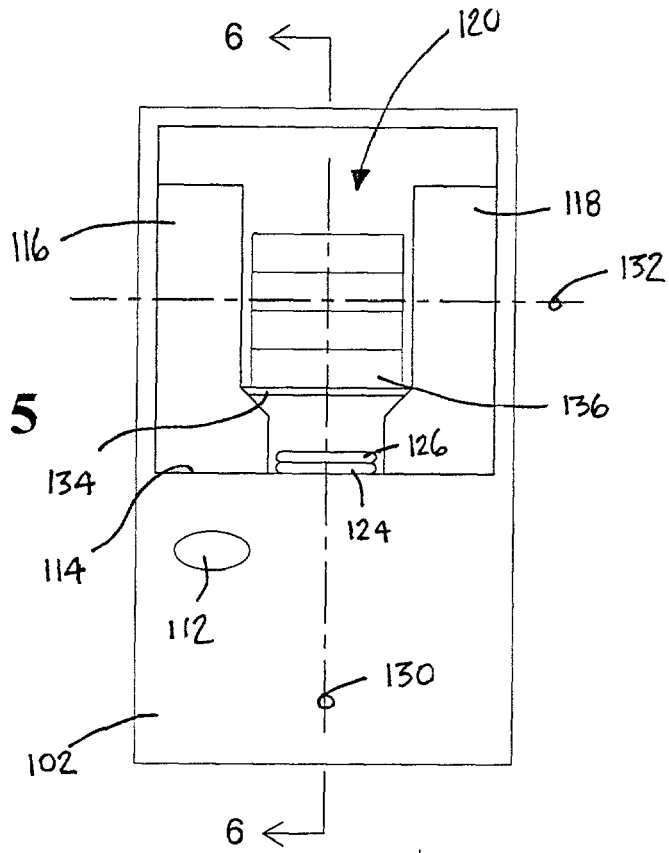
FIG. 5 is front plan view of the alternate scanner with a front panel removed.
Figure 6:
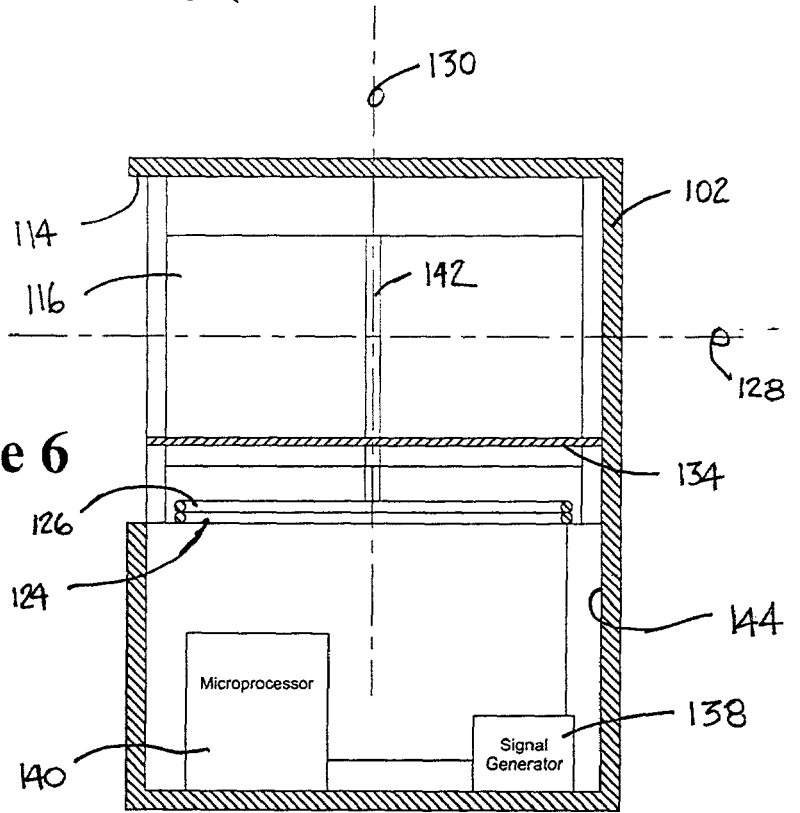
FIG. 6 is a cross section view of the alternate scanner taken along line 6-6 in FIG. 5.

Referring now to FIGS. 5 and 6, details concerning the internal components of the scanner 100 are shown. As shown, the housing 102 includes an opening 114 in which the front panel 104 (FIG. 4) fits. A first magnet 116 and a second magnet 118 are disposed within the housing 102. A generally U-shaped region 120 is established between the magnets 116, 118. FIGS. 5 and 6 further show that a transmitter 124 and a receiver 126 are disposed within the housing 102 between the magnets 116, 118. It can be appreciated that in lieu of a transmitter 124 and a receiver 126 a transceiver can be used. The transmitter 124 and receiver 126 are used to send and receive RF signals.

It is to be understood that the magnets 116, 118 are used to create a magnetic field along a Z axis 128 defined by the scanner 100 from the front of the scanner 100 to the back of the scanner 100. The scanner 100 also defines a Y axis 130 and an X axis 132. The Y axis 130 is perpendicular to the Z axis 128 and is established from the top of the scanner 100 to the bottom of the scanner 100. Also, the X axis 132 is perpendicular to the Y axis 130 and the Z axis and is established from side to side.

FIGS. 5 and 6, further show a paper media support tray 134 that can be used to support paper media 136 during the scanning process, described in detail below. FIG. 6 shows that a signal generator 138 is connected to the transmitter 124 and the receiver 126. Moreover, a microprocessor 140, e.g., as described below, is connected to the signal generator 138. Also, as shown, the first magnet 116 can be formed with a gap 142. It is to be understood that the second magnet 118 can also be formed with a gap (not shown). As shown in FIG. 6, a magnetic field shielding layer 144 can be disposed on the interior surface of the housing 102 or otherwise incorporated in the housing 102 itself.

As recognized herein, almost every element in the periodic table has an isotope with a non-zero nuclear spin. Nuclear magnetic resonance (NMR) can only be performed on isotopes whose natural abundance is high enough to be detected. Carbon-13 is an isotope of carbon that has a non-zero nuclear spin and can be detected using NMR. Naturally occurring carbon includes approximately one and one-tenth percent (1.1%) of carbon-13. Black printing ink includes about fifteen percent to twenty percent (15%-20%) of carbon black which, in turn, includes approximately ninety-seven percent to ninety-nine percent (97-99%) of naturally occurring carbon. Black toner includes approximately ten percent (10%) carbon black. Accordingly, black printing ink and black toner contains enough carbon-13 that it can be detected using NMR. On average, paper contains about thirty-eight percent (38%) of carbon and can also be detected using NMR. As such, each scanner 10, 100 described above, can be configured to detect carbon-13 in the paper media and output a three-dimensional (3-D) data set representing the carbon-13 therein. This data set can be processed as described in detail below in order to generate and electronic representation of the paper media, i.e., the paper and the ink.

Figure 7:
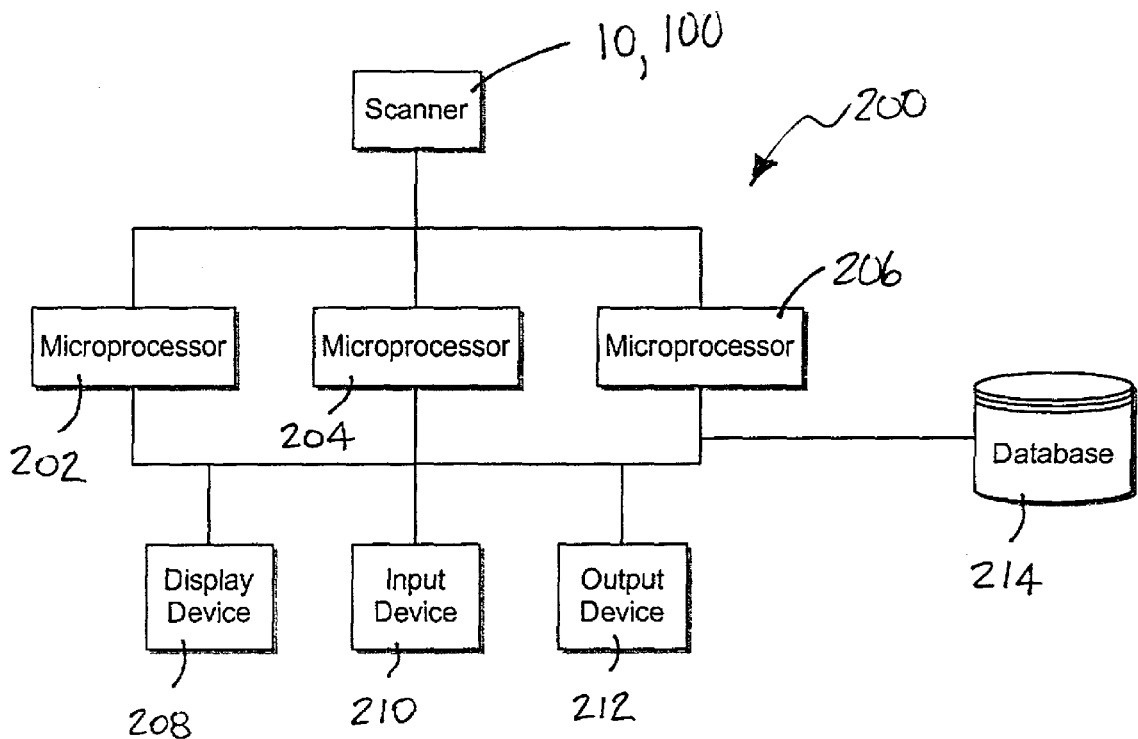
FIG. 7 is a schematic diagram of a scanning system in which either scanner can be incorporated.

Referring now to FIG. 7, a system in which either scanner 10, 100 can be incorporated is shown and generally designated 200. FIG. 7 shows that the system 200 includes a scanner, e.g., the scanner 10 shown in FIGS. 1 through 3, that is connected to a first microprocessor 202, a second microprocessor 204, and a third microprocessor 206. These microprocessors 202, 204, 206 can be connected to a display device 208, e.g., a monitor. FIG. 7 shows that in a preferred embodiment, the microprocessors 202, 204, 206 can also be connected an input device 210, e.g., a keyboard, a mouse, a light pen, etc. As shown, an output device 212, e.g., a printer, can be connected to the microprocessors 202, 204, 206. Moreover, a database 214, e.g., random access memory (RAM), can be connected to the microprocessors 202, 204, 206.

Preferably, each microprocessor 72, 140, 202, 204, 206 can include a series of computer-executable instructions, as described below, that can process a three dimensional data set representing paper media received from each scanner 10, 100. The instructions may be contained in the database 214 or on a data storage device with a computer readable medium, such as a computer diskette. Or, the instructions may be stored on a magnetic tape, conventional hard disk drive, electronic read-only memory (ROM), optical storage device, or other appropriate data storage device or transmitting device thereby making a computer program product, i.e., an article of manufacture according to the invention. In an illustrative embodiment of the invention, the computer-executable instructions may be written, e.g., using C++.

The flow charts herein illustrate the structure of the logic of the present invention as embodied in computer program software. Those skilled in the art will appreciate that the flow charts illustrate the structures of computer program code elements including logic circuits on an integrated circuit, that function according to this invention. Manifestly, the invention is practiced in its essential embodiment by a machine component that renders the program elements in a form that instructs a digital processing apparatus (that is, a computer) to perform a sequence of function steps corresponding to those shown.

Figure 8:
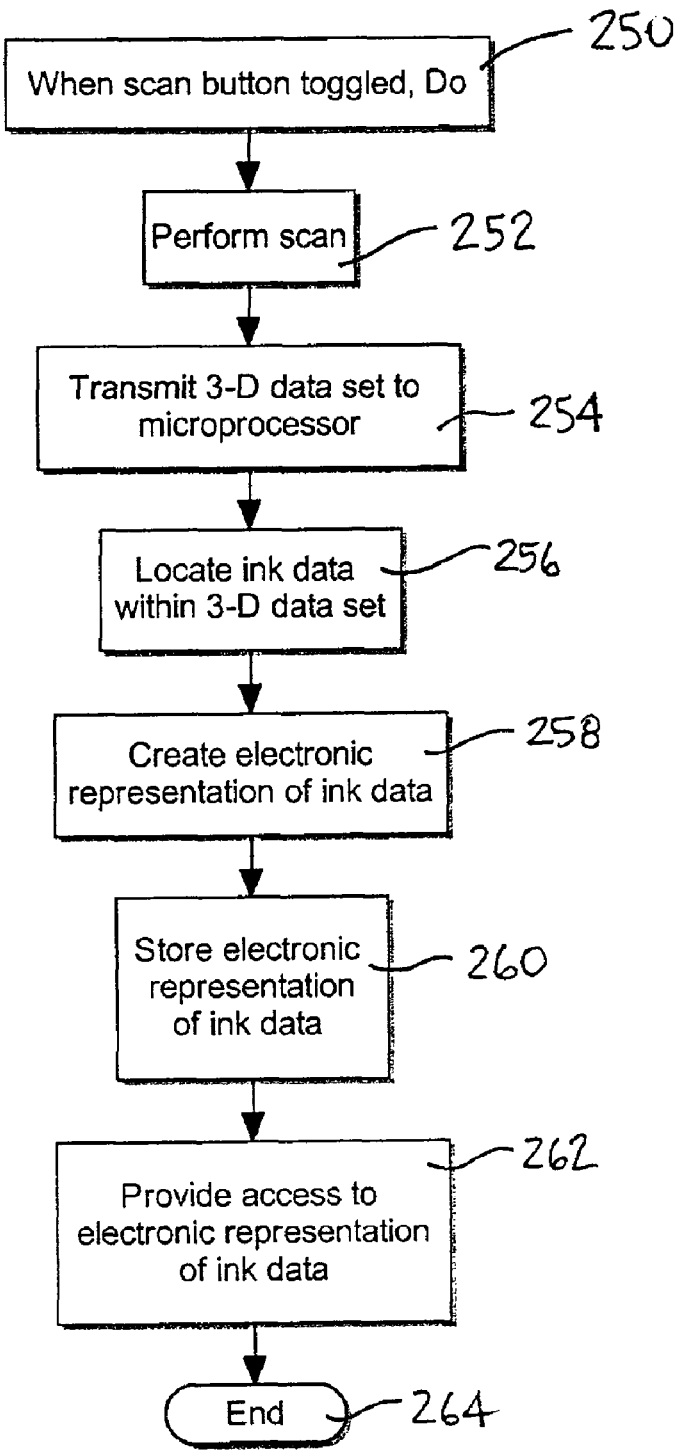
FIG. 8 is a flow chart of the overall operating logic of the present invention.

Referring to FIG. 8, the overall operating logic is shown and commences at block 250 with a do loop wherein when a scan button, e.g., the scan button 22 or the scan button 112, is toggled, the following steps are performed. At block 252, paper media 58, 136 placed with the scanner 10, 100 is scanned using NMR technology. Preferably, all staples and paperclips are removed from the paper media—if possible. In the case of some books and some magazines, it may not be possible to remove the stapes. At block 254, a 3-D data set representing printed media is transmitted to one or more of the microprocessors. Moving to block 256, ink data within the 3-D data set is located within the 3-D data set.

At block 258, an electronic representation of the ink data is created. Preferably, this electronic representation is created by "reading" the ink data with typical OCR that is well known in the art. Continuing to block 260, the electronic representation of the ink data is stored in the database 214. Then, at block 262, access to the electronic representation of the ink data can be provided. For example, a user can simply read the electronic representation on a lap top computer, desk top computer, hand held computer, wireless telephone, portable data assistant, or any other similar device well known in the art. Also, a user can search the electronic representation of the ink data using a key word search. The electronic representation of the ink data can be uploaded to a web server and made available via the Internet. And, all or portions of the electronic representation of the ink data can be printed at the output device 212. It can be appreciated that once the electronic representation of the ink data is created a range of pages can be easily located and printed, uploaded, searched, or otherwise manipulated. The logic ends at state 264.

Figure 9:
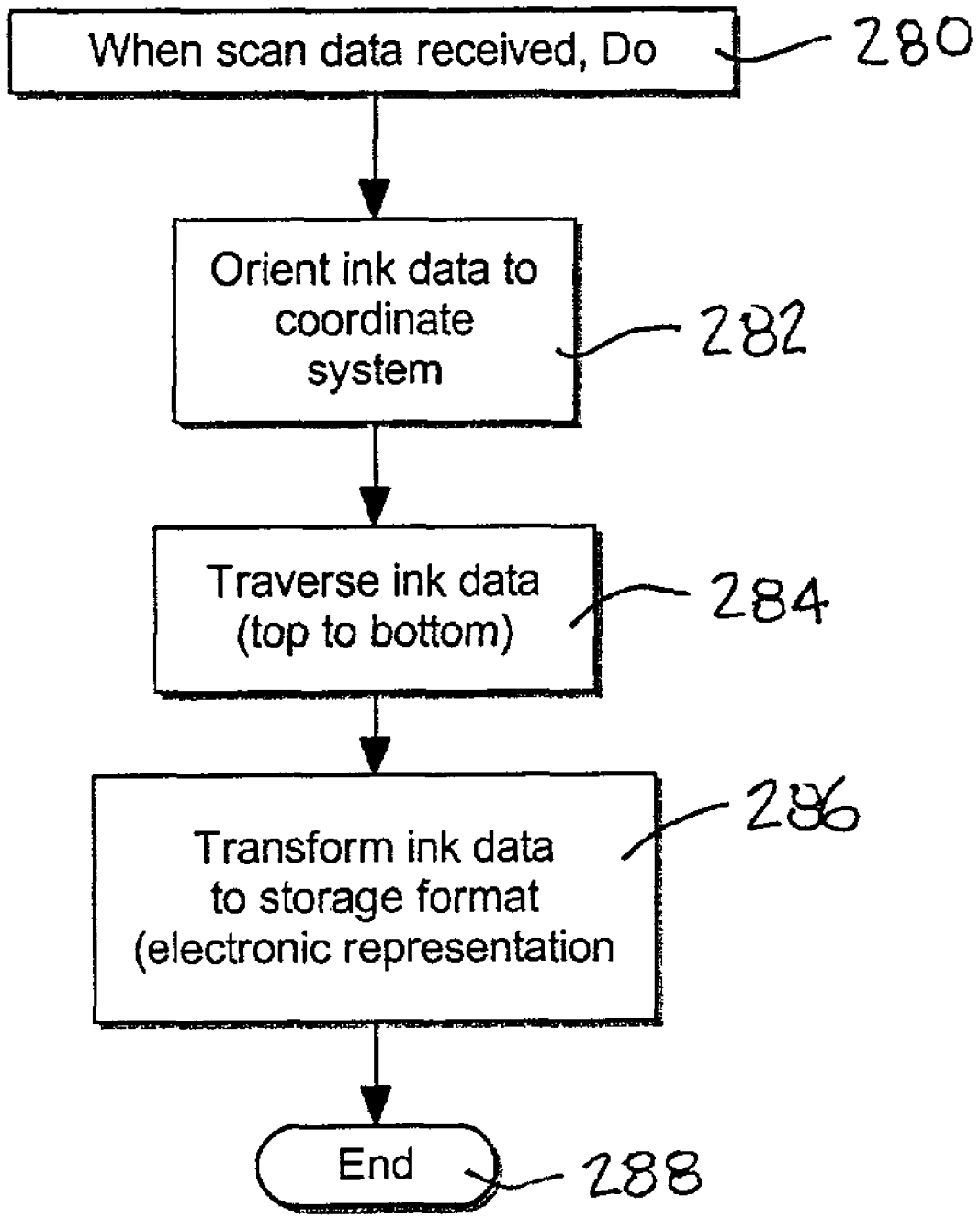
FIG. 9 is a flow chart of the pre-processing logic of the present invention.
Figure 10:
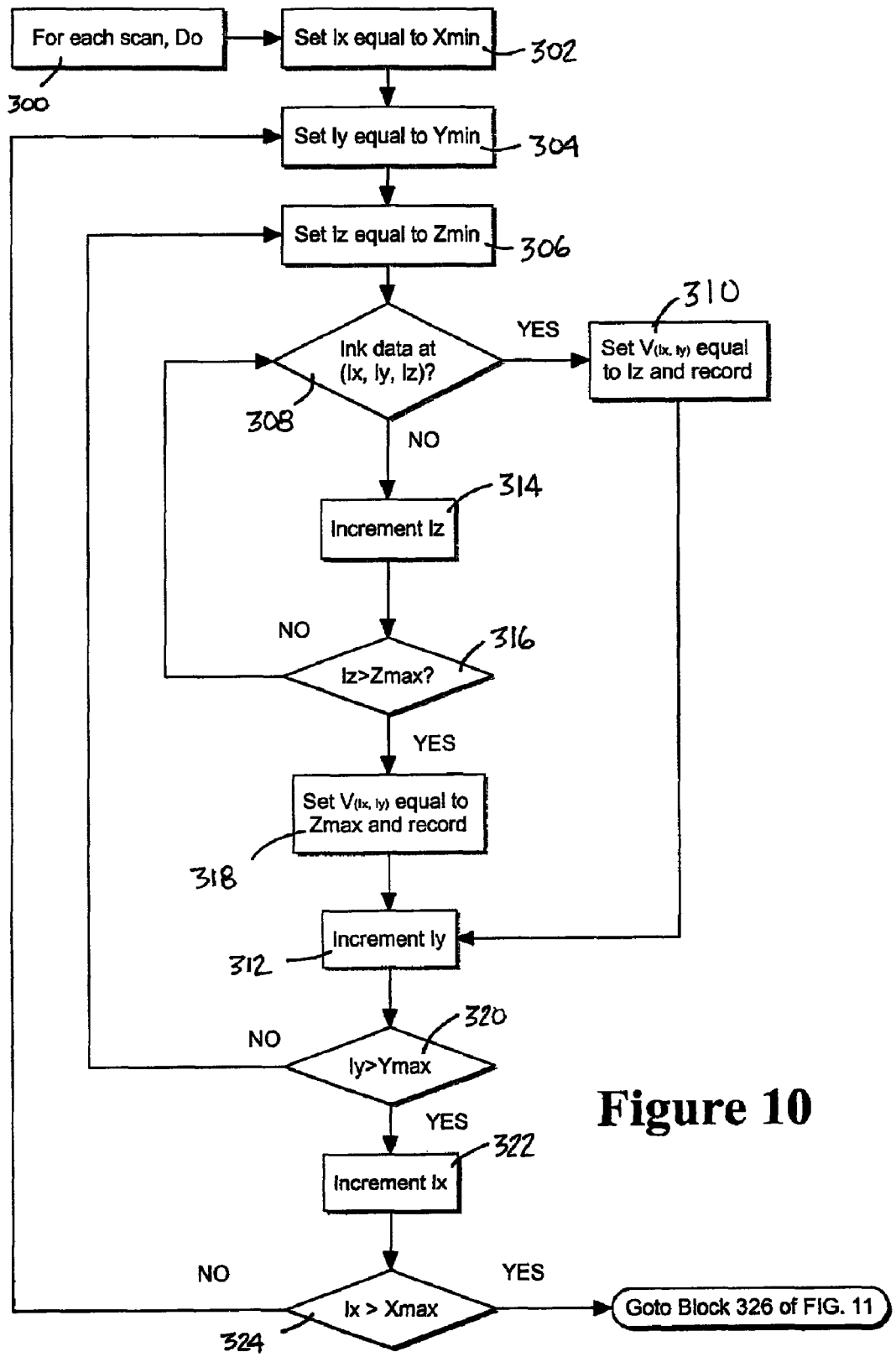
FIG. 10 is a flow chart of the orientation logic of the present invention.

Referring now to FIG. 9, the pre-processing logic is shown and commences at block 280 with a do loop wherein when scan data is received, the succeeding steps are performed. At block 282, the ink data is oriented to a predetermined coordinate system, e.g., a rectangular coordinate system. Next, at block 284, the ink data is traversed top to bottom in order to "read" the ink data. Moving to block 286, the data is transformed to a storage format, e.g., portable data format (PDF), in order to create an electronic representation of the paper media scanned by the scanner 10, 100. The logic then ends at state 288.

FIGS. 10 through 15 show the orientation logic of the present invention. Beginning at block 300 of FIG. 10, a do loop is entered wherein the steps shown in FIGS. 10 through 15 are performed. At block 302, a variable $I_x$ is set equal to $X_{min}$, where $X_{min}$ is the minimum data point of the 3-D data set along the X axis of a rectangular coordinate system. At block 304, a variable $I_y$ is set equal to $Y_{min}$, where $Y_{min}$ is the minimum data point along the Y axis. Further, at block 306, another variable $I_z$ is set equal to $Z_{min}$, i.e., the minimum data point along the Z axis of the rectangular coordinate system.

Moving to decision diamond 308, it is determined whether the data found at ($I_x$, $I_y$, $I_z$) is ink data. If so, the logic proceeds to block 310 and a variable, $V_{(Ix, Iy)}$, is set equal to $I_z$. In other words, during the first loop, if at a particular location, e.g., ($I_x$, $I_y$, $I_z$) equal to (0, 0, 5) ink data is found, the variable $V_{(0,0)}$ is set equal to five (5) and recorded. Thus, the system knows that there is ink at location (0, 0, 5). The logic then proceeds to block 312 and $I_y$ is incremented, e.g., by one integer.

Returning to decision diamond 308, if there is not any ink data at ($I_x$, $I_y$, $I_z$), the logic continues to block 314 and $I_z$ is incremented, e.g., by one integer. Next, at decision diamond 316, it is determined whether $I_z$ is greater than $Z_{max}$, i.e., the maximum data point along the Z axis. If not, the logic returns to decision diamond 308 and continues as described above. If $I_z$ is greater than $Z_{max}$, the logic moves to block 318 where $V_{(Ix, Iy)}$ is set equal to $Z_{max}$ and recorded. Next, at block 312, $I_y$ is incremented by one predefined increment.

Proceeding to decision diamond 320, it is determined whether $I_y$ is less than $Y_{max}$, i.e., the maximum data point along the Y axis of the 3-D data set. If not, the logic returns to block 306 and continues as described above. Otherwise, if Iy is greater than $Y_{max}$, the logic moves to block 322 where $I_x$ is incremented, e.g., by one predefined increment. Moving to decision diamond 324, it is determined whether $I_x$ is greater than $X_{max}$, where $X_{max}$ is the maximum data point along the X axis. If not, the logic returns to block 304 and continues as described above. On the other hand, if $I_x$ is indeed greater than $X_{max}$ the logic continues to FIG. 11. It is to be understood that the portion of the orientation logic shown in FIG. 10 can be used to determine which points in the three dimensional data set obtained during a scan represent ink. Those points that represent ink data are recorded as described above.

Figure 11:
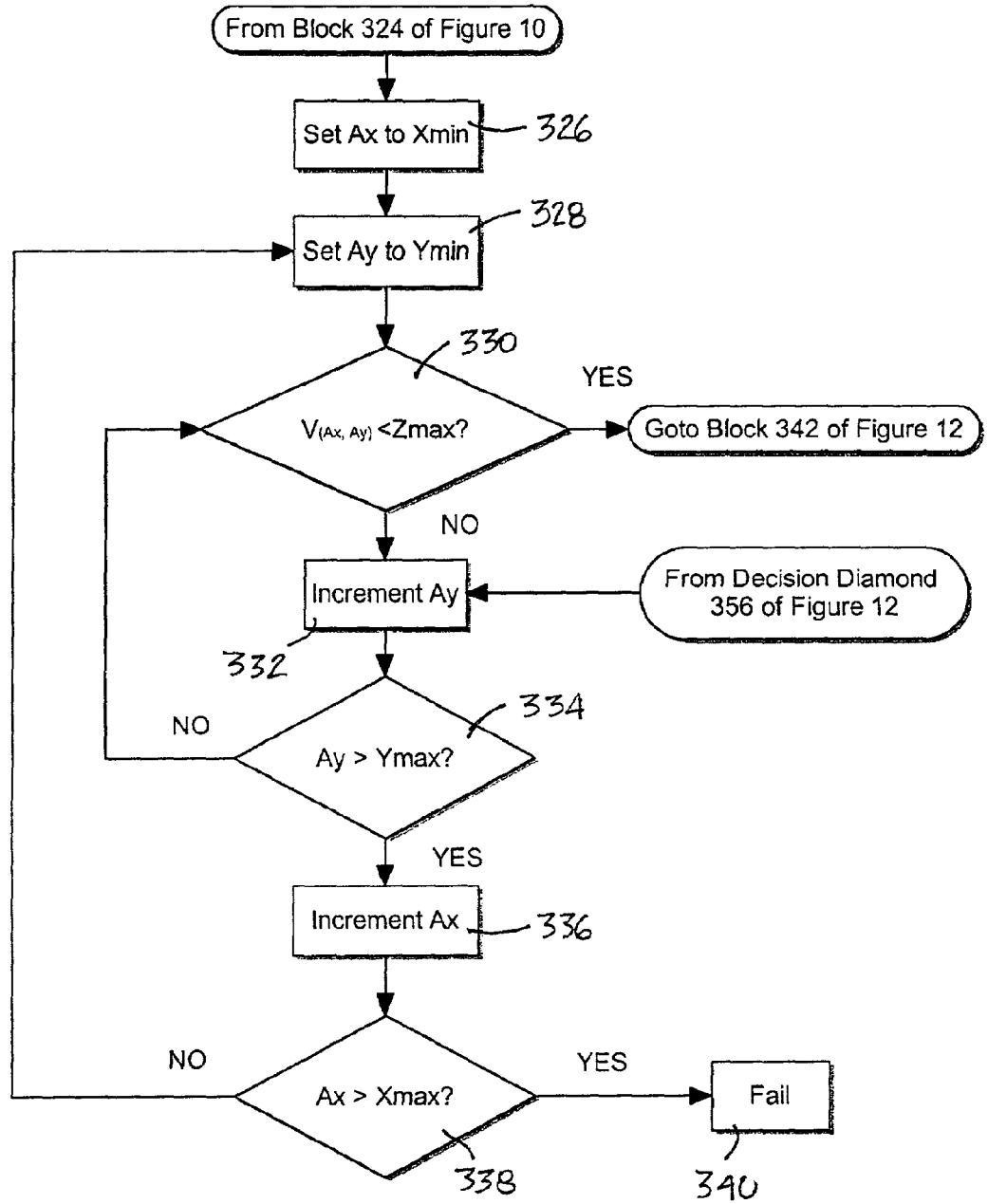
FIG. 11 is a continued flow chart of the orientation logic of the present; invention.

Moving to block 326 of FIG. 11, a variable, $A_x$, is set equal to $X_{min}$. Next, at block 328, a variable, $A_y$, is set equal to $Y_{min}$. Moving to decision diamond 330 it is determined if $V_{(Ax,Ay)}$ is less than $Z_{max}$. If not, the logic moves to block 332 and $A_y$ is incremented by one predetermined increment. If $V_{(Ax, Ay)}$ is less than $Z_{max}$, the logic moves to FIG. 12 and continues as described below. Proceeding to decision diamond 334, it is determined if $A_y$ is greater than $Y_{max}$. If not, the logic returns to decision diamond 330 and continues as described above. Otherwise, the logic moves to block 336 and $A_x$ is incremented by one predefined increment. Continuing to decision diamond 338, it is determined whether $A_x$ is greater than $X_{max}$. If so, a "Fail" signal is presented at block 340 and the logic ends. Conversely, if $A_x$ is less than or equal to $X_{max}$, the logic returns to block 328 and continues as described above.

Figure 12:
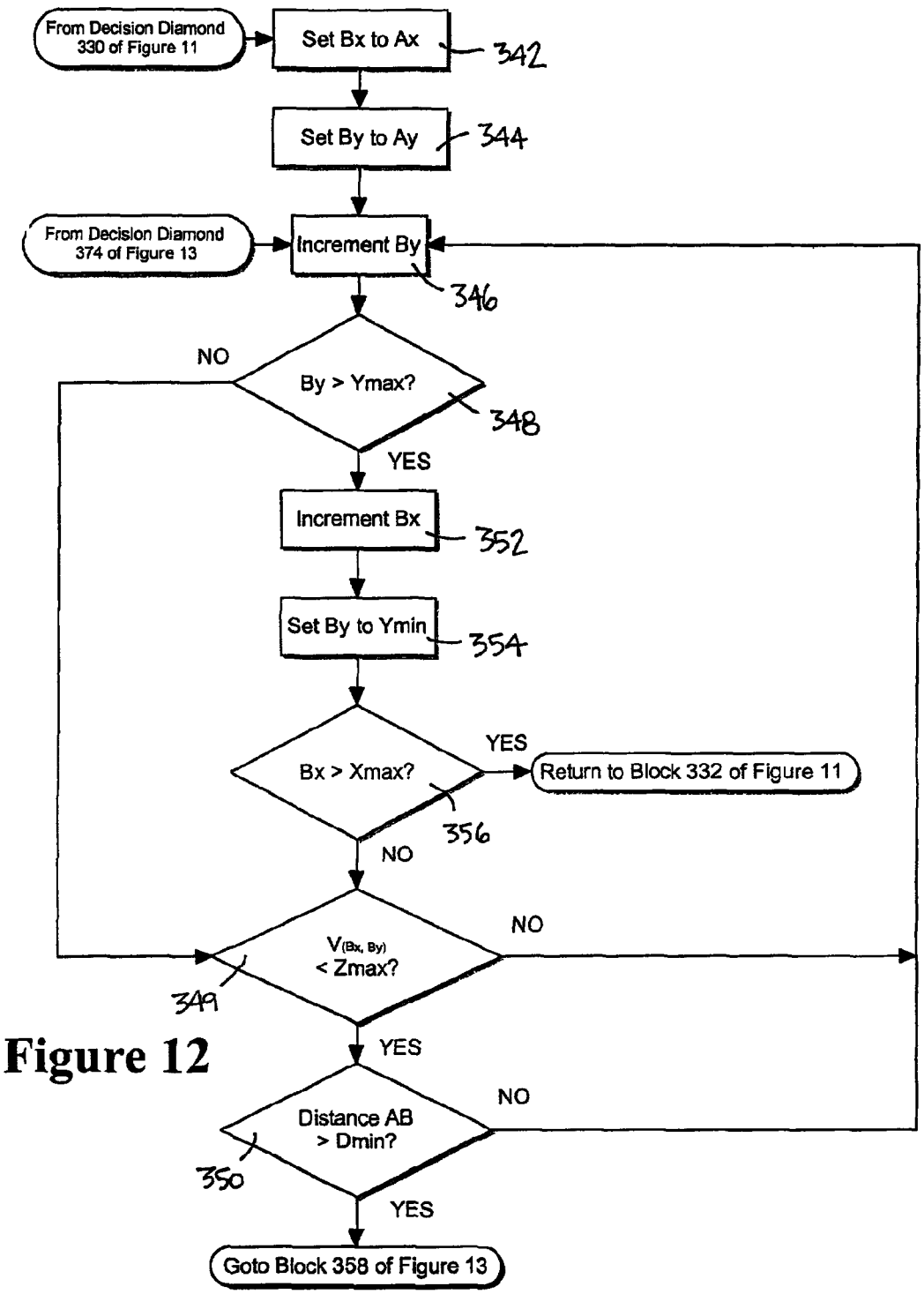
FIG. 12 is a continued flow chart of the orientation logic of the present; invention.

As described above at decision diamond 330, if $V_{(Ax,Ay)}$ is less that $Z_{max}$, the logic proceeds to block 342 of FIG. 12. At block 342, $B_x$ is set equal to $A_x$. At block 344, $B_y$ is set equal to $A_y$. Moving to block 346, $B_y$ is incremented by one predetermined increment. Next, at decision diamond 348, it is determined whether $B_y$ is greater than $Y_{max}$. If not, the logic moves to decision diamond 349 where it is determined whether $V_{(Bx, By)}$ is less than $Z_{max}$. If $V_{(Bx, By)}$ is greater than or equal to $Z_{max}$, the logic returns to block 346 and continues as described above. If $V_{(Bx, By)}$ is less than $Z_{max}$, the logic moves to decision diamond 350 and it is determined whether the distance between $A_{(Ax, Ay)}$ and $B_{(Bx, By)}$ is greater than a predetermined minimum threshold, $D_{min}$. If so, the logic moves to FIG. 13. Otherwise, the logic returns to block 346 and $B_y$ is incremented by one predetermined increment.

Returning to decision diamond 348, if $B_y$ is indeed greater than $Y_{max}$, the logic moves to block 352 where $B_x$ is incremented by one predefined increment. Then, at block 354, $B_y$ is set equal to $Y_{min}$. Moving to decision diamond 356 it is determined whether $B_x$ is greater than $X_{max}$. If so, the logic returns to block 332 of FIG. 11. If $B_x$ is less than or equal to $X_{max}$, the logic moves to decision diamond 350 and continues as described above.

Figure 13:
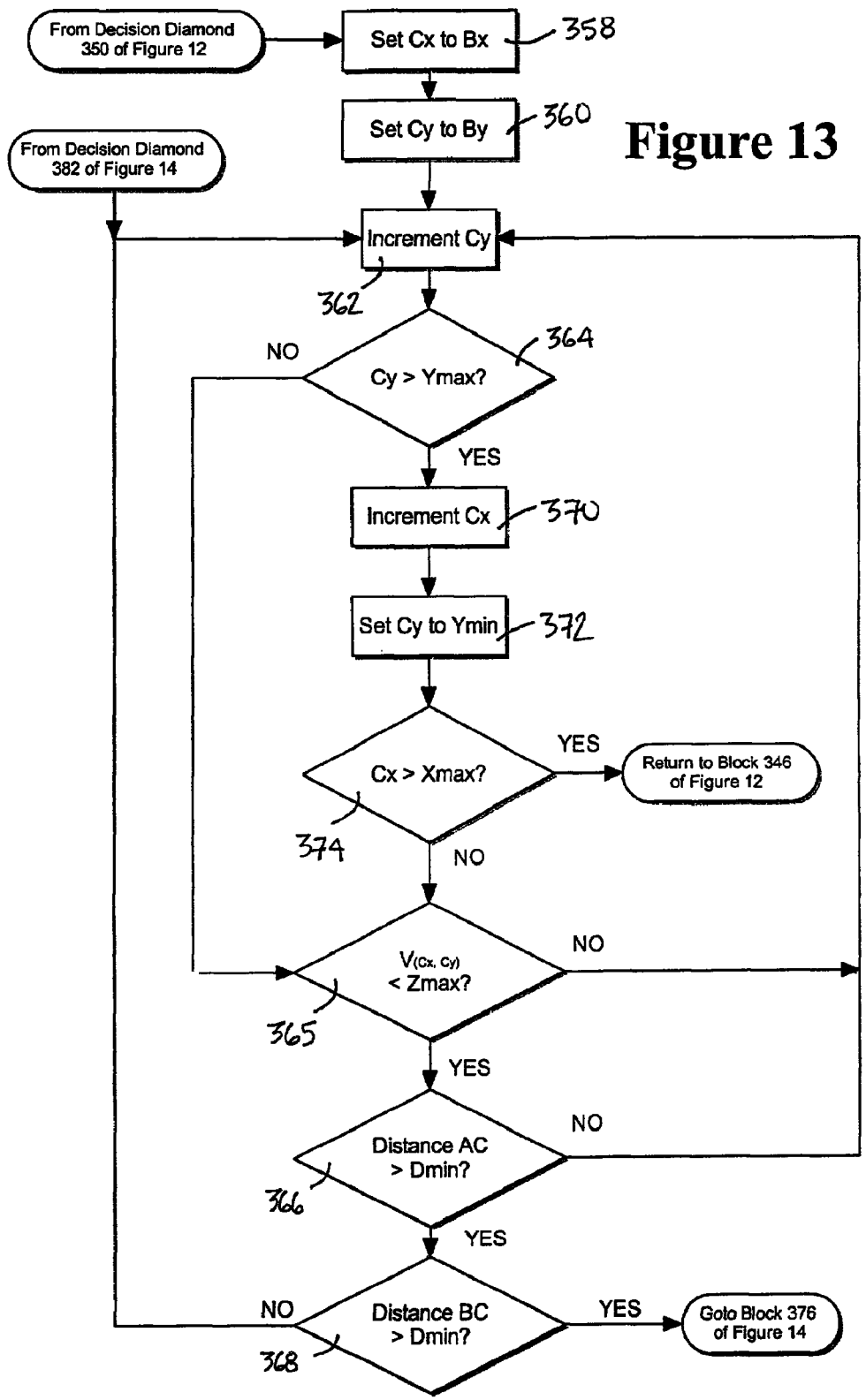
FIG. 13 is a continued flow chart of the orientation logic of the present; invention.

As described above, if the distance from $A_{(Ax, Ay)}$ to $B_{(Bx, By)}$ is greater than $D_{min}$, the logic moves to FIG. 13, i.e., block 358 of FIG. 13. At block 358, $C_x$ is set equal to $B_x$. Also, at block 360 $C_y$ is set equal to $B_y$. Continuing to block 362, $C_y$ is incremented by one predetermined increment. Next, at decision diamond 364, it is determined whether $C_y$ is greater than $Y_{max}$. If not, the logic moves to decision diamond 365 where it is determined whether $V_{(Cx, Cy)}$ is less than $Z_{max}$. If $V_{(Cx, Cy)}$ is greater than or equal to $Z_{max}$, the logic returns to block 362 and continues as described above. If $V_{(Cx, Cy)}$ is less than $Z_{max}$, the logic moves to decision diamond 366 where it is determined whether the distance between $A_{(Ax, Ay)}$ and $C_{(Cx, Cy)}$ is greater than the predetermined minimum threshold, $D_{min}$. If not, the logic returns to block 362 and continues as described above. If the distance between $A_{(Ax, Ay)}$ and $C_{(Cx, Cy)}$ is indeed greater $D_{min}$, the logic moves to decision diamond 368, where it is determined whether the distance between $B_{(Bx, By)}$ and $C_{(Cx, Cy)}$ is greater than $D_{min}$. If so, the logic continues to FIG. 14. Otherwise, the logic returns to block 362 and continues as described above.

Returning to decision diamond 364, if $C_y$ is greater than $Y_{max}$, the logic moves to block 370 where $C_x$ is incremented by one predefined increment. Then, at block 372, $C_y$ is set equal to $Y_{min}$. Moving to decision diamond 374 it is determined whether $C_x$ is greater than $X_{max}$. If so, the logic returns to block 346 of FIG. 12. If $C_x$ is less than or equal to $X_{max}$, the logic moves to decision diamond 366 and continues as described above.

Figure 14:
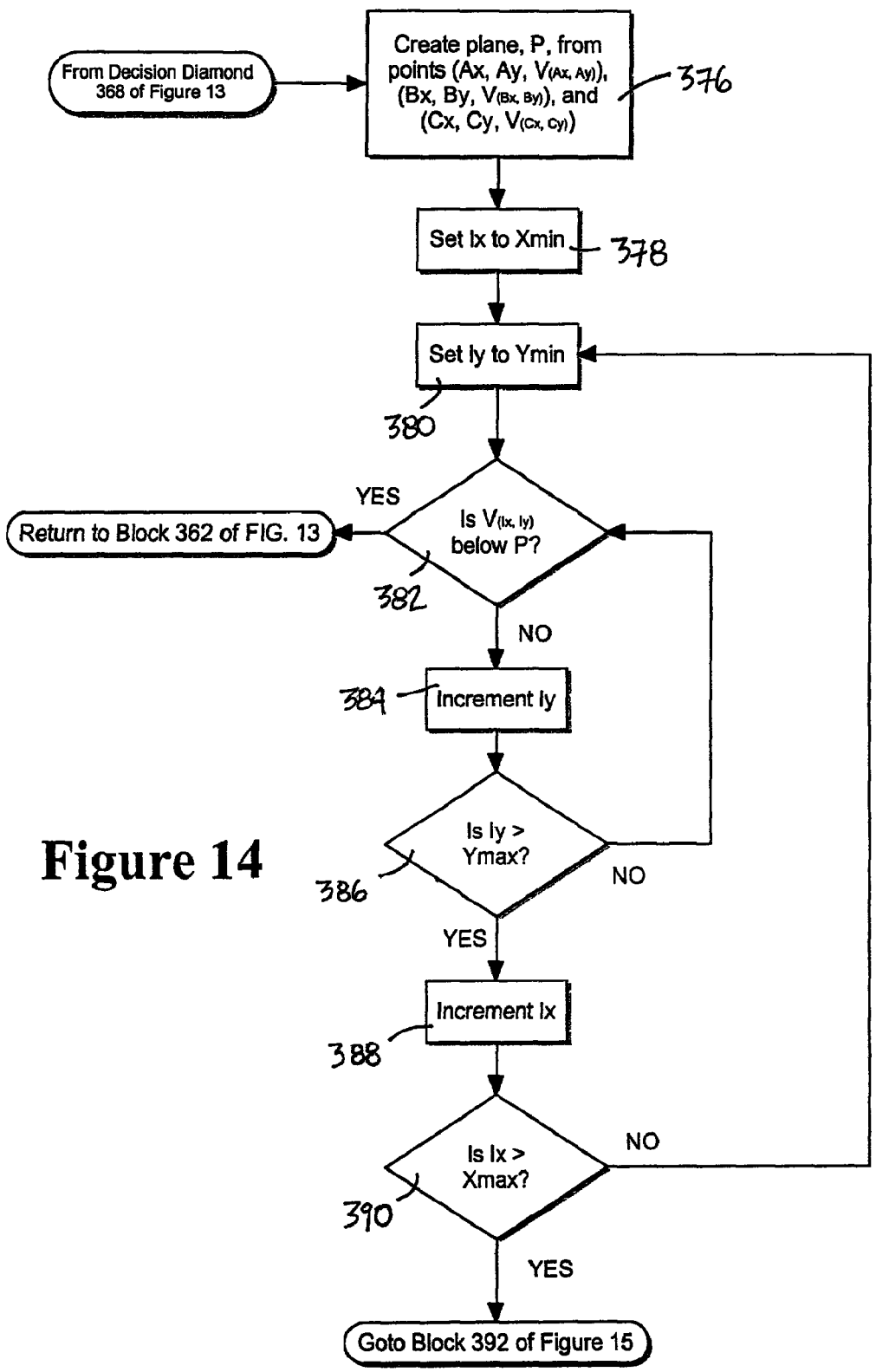
FIG. 14 is a continued flow chart of the orientation logic of the present; invention.

As stated above, at decision diamonds 366 and 368, if the distanced between $A_{(Ax, Ay)}$ and $C_{(Cx, Cy)}$ is greater $D_{min}$ and the distance between $B_{(Bx, By)}$ and $C_{(Cx, Cy)}$ is also greater than $D_{min}$, the logic moves to block 376 of FIG. 14. At block 376, a plane, P, is created using $(A_x, A_y, V_{(Ax, Ay)})$, $(B_x, B_y, V_{(Bx, By)})$, and $(C_x, C_y, V_{(Cx, Cy)})$. Then, at block 378, $I_x$ is set equal to $X_{min}$. At block 380, $I_y$ is set equal to $Y_{min}$. Proceeding to decision diamond 382, it is determined whether $V_{(Ix, Iy)}$ is below the plane, P. If so, the logic returns to block 362 of FIG. 13. If $V_{(Ix, Iy)}$ is not below P, the logic continues to block 384 and $I_y$ is incremented by one predefined increment.

Thereafter, at decision diamond 386, it is determined whether $I_y$ is greater than $Y_{max}$. If not, the logic returns to decision diamond 382 and continues as described above. If $I_y$ is greater than $Y_{max}$, the logic moves to block 388 where $I_x$ is incremented by one predefined increment. Moving to decision diamond 390, it is determined whether $I_x$ is greater than $X_{max}$. If not, the logic returns to block 380 and continues as described above. Otherwise, if $I_x$ is greater than $X_{max}$, the logic continues to block 392 of FIG. 15.

Figure 15:
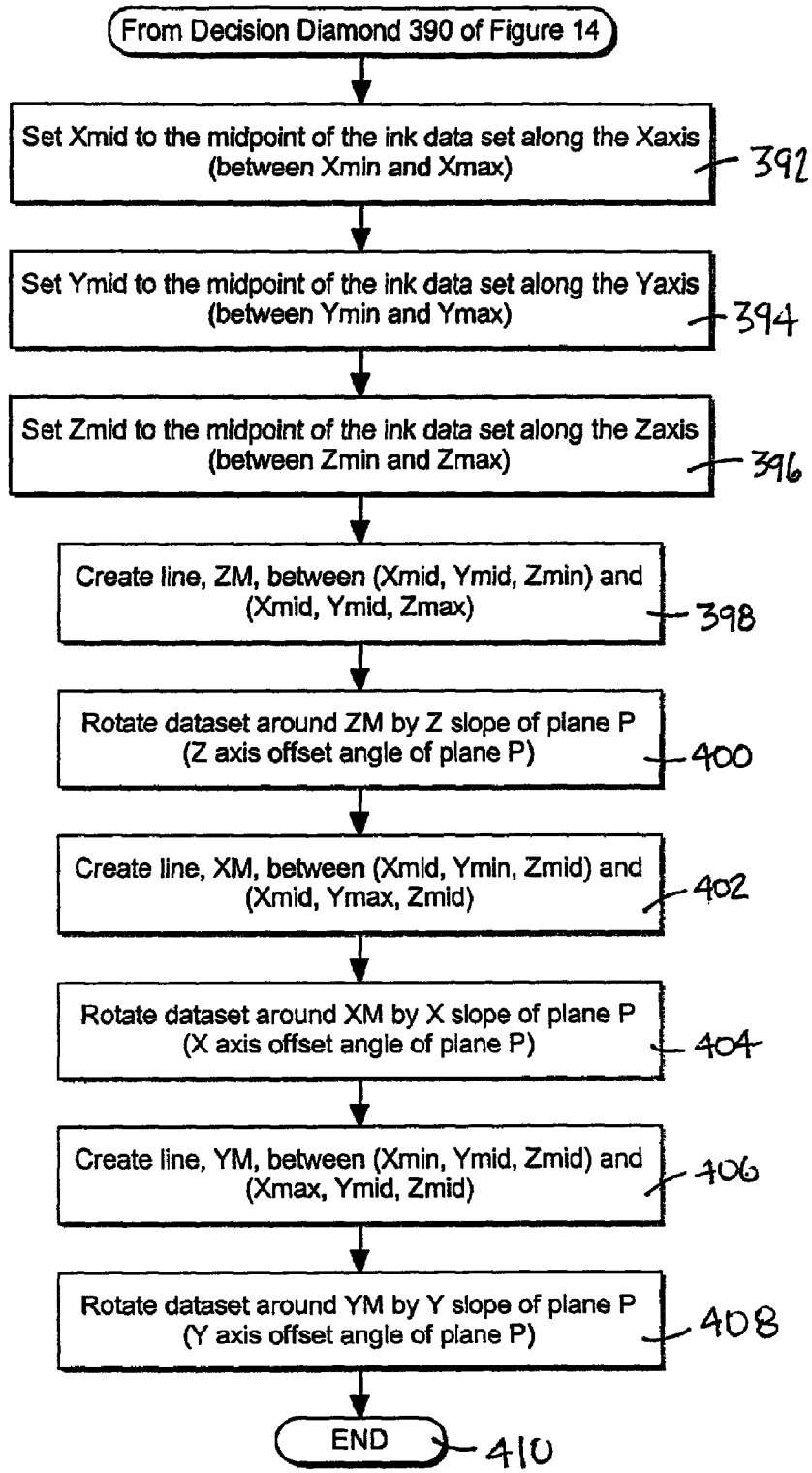
FIG. 15 is a continued flow chart of the orientation logic of the present; invention.

At block 392 of FIG. 15, a variable $X_{mid}$ is set to the midpoint of the data set along the X axis of the between $X_{min}$ and $X_{max}$. At block 394, a variable $Y_{mid}$ is set to the midpoint of the data set along the Y axis between $Y_{min}$ and $Y_{max}$. Moreover, at block 396, a variable $Z_{mid}$ is set to the midpoint of the data set along the Z axis between $Z_{min}$ and $Z_{max}$. Continuing to block 398, a line, $Z_M$, is created between $(X_{mid}, Y_{mid}, Z_{min})$ and $(X_{mid}, Y_{mid}, Z_{max})$. Then, at block 400, the entire dataset is rotated around $Z_M$ by the Z slope of the plane, P, in order to eliminate any offset angle of the plane P with respect to the Z axis.

Moving to block 402, a line, $X_M$, is created between $(X_{mid}, Y_{min}, Z_{mid})$ and $(X_{mid}, Y_{max}, Z_{mid})$. Then, at block 404, the dataset is rotated about $X_M$ by the X slope of the plane P in order to eliminate any offset angle of the plane P with respect to the X axis. At block 406, a line, $Y_M$, is created between $(X_{min}, Y_{mid}, Z_{mid})$ and $(X_{max}, Y_{mid}, Z_{mid})$. Then, at block 408, the entire dataset is rotated around $Y_M$ by the Y slope of the plane, P, in order to eliminate any offset angle of the plane P with respect to the Y axis. The logic then ends at state 410. Accordingly, the ink data has been found and aligned with the rectangular coordinate system.

Figure 16:
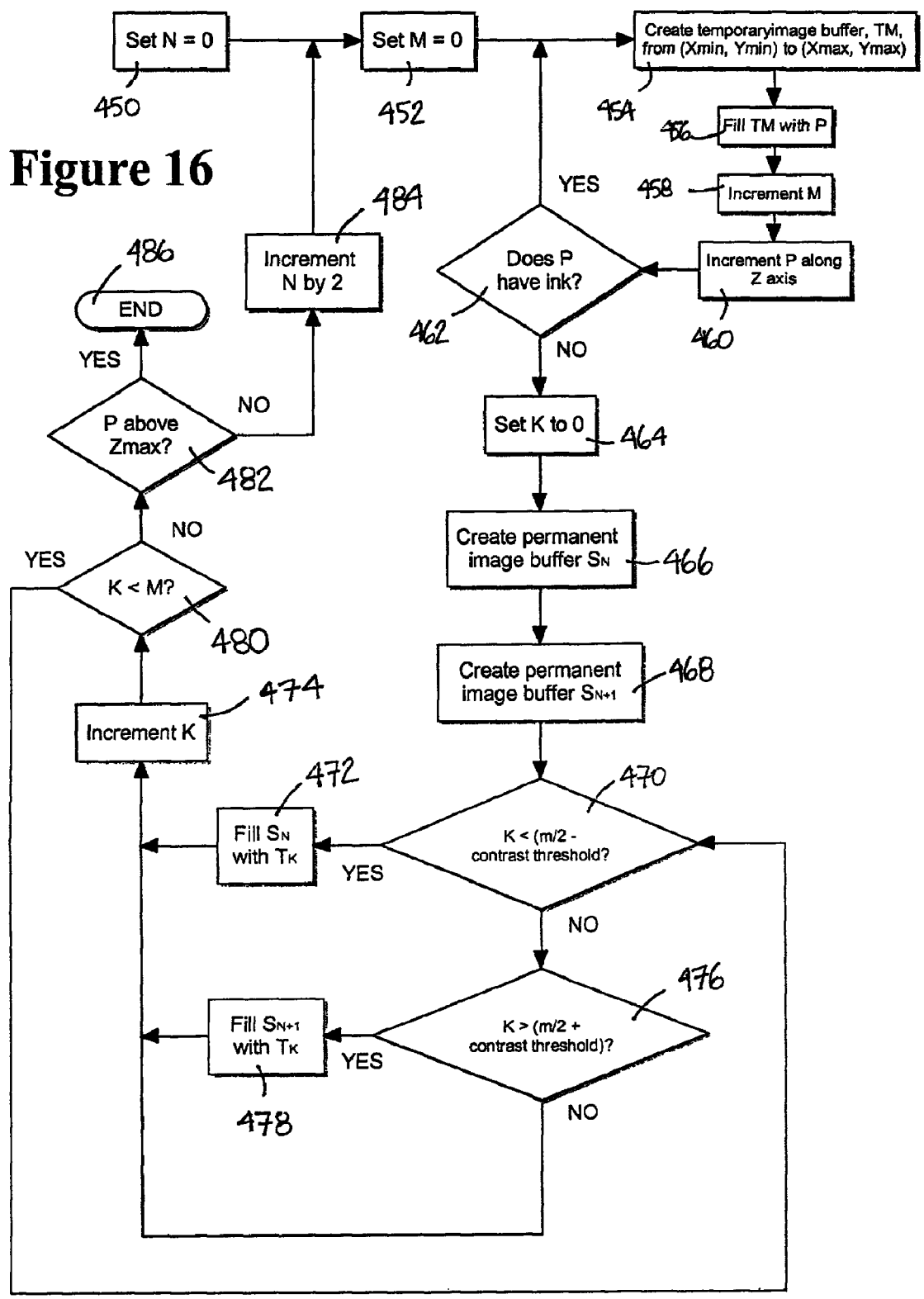
FIG. 16 is a flow chart of the data traversing logic of the present invention.

Referring now to FIG. 16, the data traversing logic of the present invention is shown and commences at block 450 wherein a variable N is set equal to zero (0). At block 452, another variable M is also set equal to zero (0). Proceeding to block 454, a temporary image buffer, $T_M$, is created from $(X_{min}, Y_{min})$ to $(X_{max}, Y_{max})$. Then, at block 456 $T_M$ is filled with data from plane P, which is the lowest plane of ink found as described above. Continuing to block 458, M is increased by a predefined increment. Moreover, P is incremented along the Z axis by one predefined increment at block 460.

Moving to decision diamond 462, it is determined whether P includes ink data. If so, the logic returns to block 454 and continues as described above. On the other hand, if P does not have ink, the logic moves to block 464 where a variable K is set equal to zero (0). Then, at block 466 a permanent image buffer $S_N$ is created. At block 468, another permanent image buffer $S_{N+1}$ is created.

Proceeding to decision diamond 470, it is determined whether K is less than one-half M minus a predetermined contrast threshold ($M/2-C_T$). It is to be understood that the contrast threshold is no larger than the number of layers of ink between two facing pages that can be detected using the scanner 10, 100 described above. If K is less than one-half M minus the contrast threshold the logic moves to block 472 where $S_N$ is filled with the ink data in $T_K$. It is to be understood that the ink data is added to any ink data previously in $S_N$. The logic then moves to block 474 where K is increased by a predetermined increment.

On the other hand, if K is greater than one-half M minus the contrast threshold, the logic proceeds to decision diamond 476 where it is determined whether K is greater than one-half M plus the contrast threshold ($M/2+C_T$). If so, $S_{N+1}$ is filled with the data within $T_K$ at block 478. Then, the logic continues to block 474 where K is increased by the predetermined increment. If K is less than or equal to one-half M plus the contrast threshold, the logic moves directly to block 474 and K is increased by a predetermined increment, as described above.

Moving to decision diamond 480, it is determined whether K is less than M. If so, the logic returns to decision diamond 470 and continues as described above. If K is greater than or equal to M, the logic continues to decision diamond 482 where it is determined whether the plane, P, is above $Z_{max}$. If not, the logic moves to block 484 where N is incremented by two (2) predetermined increments. The logic then returns to block 452 and continues as described above. On the other hand, if P is above $Z_{max}$ at decision diamond 482, the logic ends at state 486.

Using the above-described logic, printed media, e.g., loose documents, books, magazines, etc., that is placed in the scanner 10, 100 can be scanned using NMR. The carbon-13 in the paper and the carbon-13 in the ink react to the NMR and data representing the paper and the ink is output to a microprocessor. The data representing the ink can be separated or filtered from the total data and used to create an electronic representation of the printing on the paper media. Accordingly, relatively high volumes of stacked printed media can be relatively quickly scanned into an electronic database. This database can then be searched using keywords, etc. It is to be understood that other colors of ink can be used if they include an isotope that is reactive to NMR.

Moreover, it is to be understood that other non-invasive scanning techniques such as computed tomography (CT), terahertz radiation (T-ray) detection, etc., can be used to generate a 3-D dataset of printed media. The 3-D data set can be processed as described above in order to generate an electronic representation of printed media.

While the particular DEVICE, SYSTEM, AND METHOD FOR SCANNING PAPER MEDIA as herein shown and described in detail is fully capable of attaining the above-described aspects of the invention, it is to be understood that it is the presently preferred embodiment of the present invention and thus, is representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it is to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. section 112, sixth paragraph, unless the element is expressly recited using the phrase "means for."

The invention claimed is:

1. A device for scanning paper media, comprising:
   at least one magnet;
   at least one magnetic field emanating from the magnet;
   at least one transmitter;
   at least one receiver; and
   at least one tray placed within the magnetic field, the tray being configured to receive stacked printed media to be scanned in the magnetic field.

2. The device of claim 1, wherein the device is configured to detect carbon-13 in the printed media.

3. The device of claim 2, further comprising:
   at least one microprocessor connected to the receiver, the microprocessor receiving a three-dimensional data set representing the printed media.

4. The device of claim 3, wherein the microprocessor comprises:
   a program for creating an electronic representation of the printed media from the three-dimensional data set.

5. The device of claim 4, wherein the microprocessor creates the electronic representation of the printed media from ink data within the three-dimensional data set.

6. A system for scanning paper media, comprising:
   at least one microprocessor; and
   a scanner connected to the microprocessor, the seamier simultaneously scanning two or more printed pages using computed tomography and sending a three-dimensional data set to the microprocessor representing the printed pages, wherein data representing ink is filtered from the three-dimensional data set and used to create an electronic representation of printing on the printed pages.

7. The system of claim 6, wherein the microprocessor comprises:
   a program for creating an electronic representation of the printed pages from the three-dimensional data set.

8. The system of claim 7, wherein the microprocessor creates the electronic representation of the printed pages from ink data within the three-dimensional data set.

9. The system of claim 7, further comprising an output device connected to the microprocessor.

10. The system of claim 7, further comprising a display device connected to the microprocessor.

11. A scanner, comprising:
    means for receiving two or more pieces of stacked paper media;
    means for scanning the stacked paper media using computed tomography to create a three-dimensional data set representing the stacked paper media;
    means for separating data representing ink from the three dimensional data set; and
    means for creating an electronic representation of the stacked paper media from the three dimensional data set.

12. The scanner of claim 11, further comprising:
    means for locating ink data within the three dimensional data set representing the stacked paper media.

13. A method for processing paper media, comprising the acts of:
    placing at least two pages of printed media within a scanning device;
    scanning the at least two pages of printed media using computed tomography to generate a three-dimensional data set of the printed media;
    locating ink data within the three-dimensional data set; and
    filtering the ink data from the three-dimensional data set.

14. The method of claim 13, further comprising:
    creating an electronic representation of the printed media from the three-dimensional data set.

15. The method of claim 14, wherein the electronic representation of the printed media is created from the ink data.

* * * * *